United States Patent [19]

Tomlinson

[11] 4,005,316

[45] Jan. 25, 1977

[54] SWITCHING TRANSIENT SUPPRESSION CIRCUIT

[75] Inventor: John H. Tomlinson, Bridgeport, Conn.

[73] Assignee: United Technologies Corporation, Hartford, Conn.

[22] Filed: Dec. 18, 1975

[21] Appl. No.: 641,974

[52] U.S. Cl. .......................... 307/247 A; 307/290; 340/365 E

[51] Int. Cl.$^2$ .................. H03K 5/01; H01H 33/58; H01H 7/00

[58] Field of Search ............. 307/247 A, 290, 308; 340/365 E; 317/11 R, 11 A; 178/17 R, 17 A, 17 L, 17 D, 81

[56] References Cited

UNITED STATES PATENTS

| | | | |
|---|---|---|---|
| 3,513,333 | 5/1970 | Andersen | 307/247 A |
| 3,715,747 | 2/1973 | Hanson et al. | 340/365 E |

*Primary Examiner*—John Zazworsky

[57] ABSTRACT

A circuit responsive to a change in the state of a switch for suppressing spurious electrical pulses associated with switch contact opening and closing. The suppression circuit includes a dual Schmitt trigger having its individual trigger circuits connected in series and having the input of the first trigger stage clamped to a first output of the first trigger stage to delay firing of the trigger circuits until switching transients have subsided. The dual trigger is provided with an output disable input whereby outputs of the series connected trigger circuits may be caused to assume a high resistance state thereby permitting a plurality of the suppression circuits to be connected between input switches and a common logic bus.

9 Claims, 1 Drawing Figure

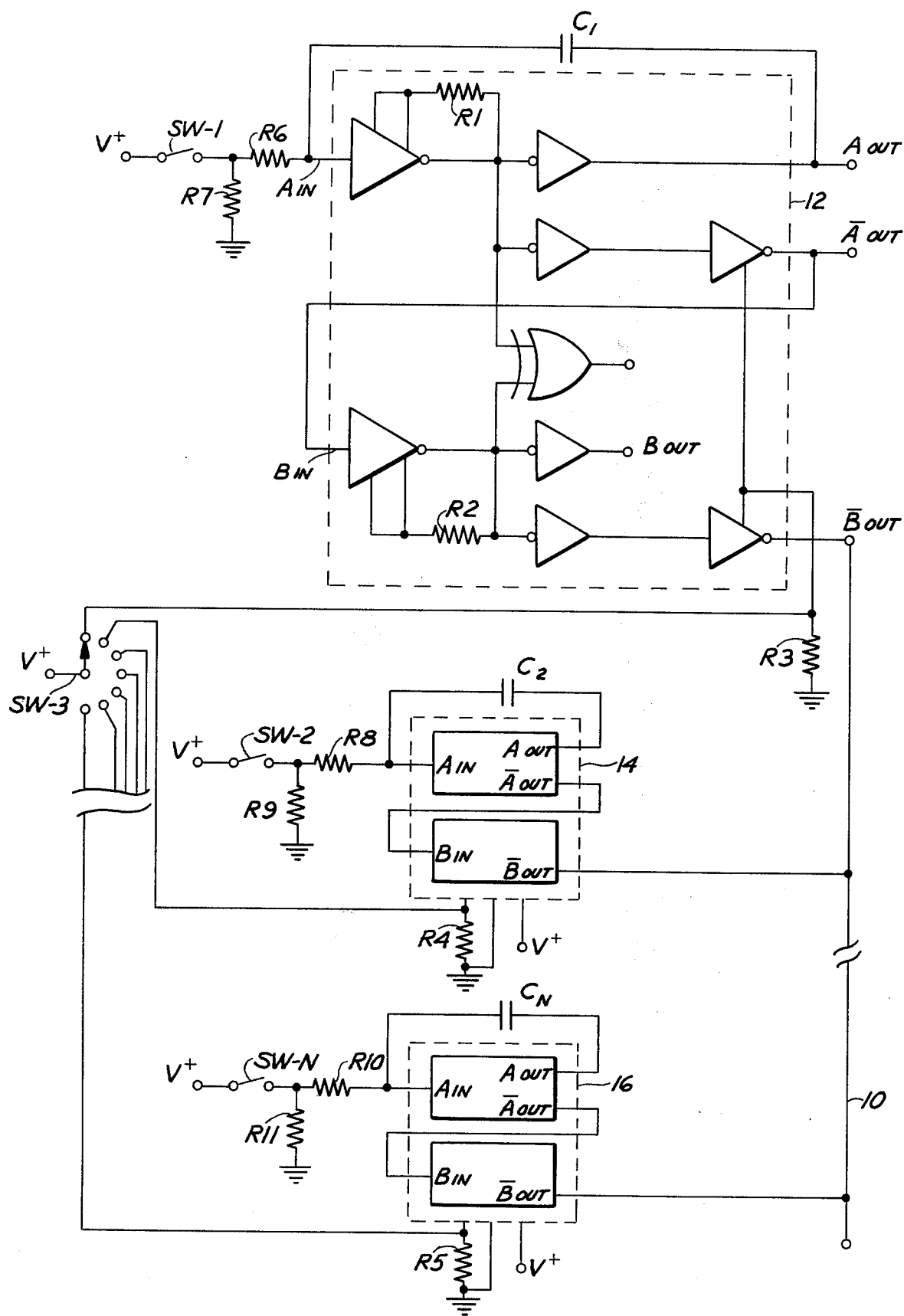

SWITCHING TRANSIENT SUPPRESSION CIRCUIT

BACKGROUND OF THE INVENTION:

1. Field of the Invention

The present invention relates to the isolation of equipment from transients which occur upon the opening or closing of switch contacts wherein the state of such switch contacts constitutes input information to the equipment. More specifically, this invention is directed to circuits for suppressing undesirable switch contact noise. Accordingly, the general objects of the present invention are to provide novel and improved methods and apparatus of such character.

2. Description of the Prior Art

It is common practice, particularly in process or equipment control applications, to employ mechanical or electromechanical switches to generate input information for data processing systems. As is well known, switch contacts usually do not close completely in one swing, a condition known as "bounce", and do not customarily open completely in one swing, a condition known as "chatter". As the contacts close and bounce and as the contacts open and chatter undesirable secondary signal fluctuations ae superimposed on the primary on-off signal. These secondary signal fluctuations, also known as noise or switching transients, may have a magnitude equal to that of the primary signal and can be incorrectly interpreted by the data processing system whereby an undesirable control action may be taken or an incorrect equipment status indication provided.

There have, in the prior art, been numerous techniques and apparatus proposed for isolating data processing equipment from switching transients. Such apparatus is generally known in the art as "switch debouncers". In their most basic form the prior art switch debouncers were passive devices and comprised merely a filter circuit interposed between the switch contacts and the equipment utilizing the switch state as input information. Such filter circuits, which may consist merely of a bypass capacitor or comprise a more complex form of low pass filter, cause large undesirable time delays between the switch closure and the application of a signal to the equipment responsive thereto. It has also been proposed to utilize multivibrator circuits interposed between the switch contacts and utilization equipment in order to isolate the contact noise from the electronic load. The prior art "active" switch debouncers which employed multivibrators to couple switch status change information to a load have been characterized by a number of inherent deficiencies. Thus, the prior art switch debouncers of the active type have been unsuitable for use with single pole single throw switches, have required plural voltage sources for operation and have been incapable of having their outputs connected to a common information bus.

SUMMARY OF THE INVENTION

The present invention overcomes the above briefly discussed and other deficiencies and disadvantages of the prior art by providing a novel and improved switch debouncer. A switch debouncer, or coupling circuit, in accordance with the present invention is characterized by requiring only a single variable voltage source for operation. The debouncer in accordance with the present invention is further characterized by an output which is switched to a high impedance state when its output disable contacts are in the open condition; the provision of high impedance output permitting a plurality of the present switch to be coupled to a common information bus.

A switch debouncer in accordance with the present invention comprises a dual Schmitt trigger connected in a cascaded fashion with the output of the first trigger stage being clamped to the input via a capacitor. The first trigger stage will not "fire" until the clamping capacitor charges to the triggering potential and the circuit constants are selected so that this will not occur until the input signal has stabilized. Each stage of the dual Schmitt trigger is provided with a threshold hysteresis resistor which insures that turn off, subsequent to opening of the input switch contacts, will not occur until the switching transients have decayed at least to an acceptable level; i.e., until after switch chatter has finished; at which time the clamping capacitor will be discharged below the trip point and the dual trigger will revert to its initial state thus presenting a high impedance at its output terminal.

BRIEF DESCRIPTION OF THE DRAWING

The present invention may be better understood and its numerous objects and advantages will become apparent to those skilled in the art by reference to the accompanying drawing which is a functional circuit diagram of an improved switch debouncer in accordance with the present invention.

DESCRIPTION OF THE PREFERRED EMBODIMENT

With reference now to the drawing, a functional block diagram of a preferred embodiment of the present invention is depicted. The purpose of the embodiment of the FIGURE is to couple information commensurate with the closing of any one of switches SW-1, SW-2 and SW-N to a common information bus conductor 10. For this purpose the circuit employs dual Schmitt trigger circuits 12, 14 and 16 respectively interposed between input switches SW-1, SW-2 and SW-N and bus conductor 10. The dual Schmitt triggers may, for example, comprise integrated circuits such as type MC14583 available from Motorola Semiconductors, Phoenix, Ar. The dual Schmitt trigger 12 has been depicted in the drawing in the form of a logic diagram and it will be obvious to those skilled in the art that each Schmitt trigger stage of circuit 12 is functionally independent except for a common 3-state input and an internally-connected Exclusive OR output. In accordance with the present invention the Exclusive OR output is not employed and in the disclosed embodiment the A output of the "first" Schmitt trigger stage of the dual trigger circuit is coupled to the input of the "second" Schmitt trigger. Each of dual Schmitt trigger circuits 12, 14 and 16 has an "output disable" input. In the absence of a "1" applied to the output disable input of the dual Schmitt trigger, regardless of the state of the other input to the circuit, the A and B outputs of the circuit will both present a high resistance. Conversely, when a "1"; i.e., a positive potential; is applied to the output disable input of the dual Schmitt trigger, the B output will "switch" to a logic state commensurate with the A input to the device; i.e., with a "1" at the output disable input of the dual Schmitt trigger the B output will be either a "1" or "0" depending upon the state of the input switch coupled to the A input to the dual Schmitt trigger.

Each of dual trigger circuits 12, 14 and 16 is provided, between its A output and its A input, with a clamping capacitor; these clamping capacitors being respectively indicated at C1, C2 and $C_N$. Additionally, each stage of each dual trigger circuit includes a threshold hysteresis resistor which sets the difference between the up-down trip levels of the Schmitt triggers. These hysteresis resistors are indicated at R1 and R2 in dual trigger circuit 12. Also, each of the output disable inputs to the dual Schmitt trigger circuits are provided with resistors connected to ground to prevent the output disable inputs from floating when a "1" input is not applied thereto. These resistors, indicated respectively as R3, R4 and R5 for dual trigger circuits 12, 14 and 16, have comparatively high resistance. The "1" input signals which are applied to the output disable inputs to the dual Schmitt triggers are derived from a multi-position switch SW-3 which selectively couples the output disable input of each one of the dual Schmitt triggers to a source of positive voltage. This positive voltage source, indicated as $V^+$, may be the same DC supply voltage employed for operation of the Schmitt triggers.

In operation, assuming that switch SW-3 is in the position shown, dual trigger circuits 14 and 16 will be presenting high resistances to the common information bus 10 and a "1" will be applied to the output disable input of dual trigger circuit 12. Upon closing of switch SW-1, switching transients will be generated as a result of contact bounce and these transients will be superimposed on the primary "on" signal; the "on" signal being the positive potential applied to the A input of circuit 12. The applied input signal will begin charging capacitor C1 and the voltage at the A input to circuit 12 will rise exponentially until it reaches the trigger level of circuit 12. When the input voltage reaches the trigger level, the first stage of the Schmitt trigger will fire and the $A_{out}$ voltage will instantly rise to the level of the supply voltage $V^+$. This, in turn, causes the input voltage to rise instantaneously thereby holding $A_{in}$ above the trigger level until the bouncing of the switch contacts is finished. The firing of the first stage of the dual trigger circuit will cause the switching of the second stage of the dual trigger whereby the $B_{out}$ terminal of the dual Schmitt trigger will present, to information bus 10, a signal commensurate with the supply voltage $V^+$ immediately upon the firing of the first stage of the dual Schmitt trigger.

When switch SW-1 is opened the capacitor C1 will hold the input voltage at terminal $A_{in}$ above the trigger level until the switch chatter is finished; capacitor C1 being discharged to ground through input resistors R6, R7. When the input voltage drops below the trigger level, the Schmitt trigger will switch back to its initial state and the $A_{out}$ terminal will instantly go to signal ground. When the first stage of the dual Schmitt trigger switches back to its initial state as a result of the discharge of capacitor C1, the B output will also revert to its initial state, which is essentially ground potential, and the "1" signal will be removed from bus 10.

Dual trigger circuits 14 and 16 operate in the same manner as circuit 12 and circuits 14 and 16 are respectively provided with input resistors R8, R9 and R10, R11 which define a discharge path for the clamping capacitors.

A switch debouncer in accordance with the present invention has the further advantage of having complementary outputs, for example in the form of the $A_{out}$ and $\overline{A_{out}}$ outputs of the first stage of dual trigger 12. Such complementary outputs are often desired. Another advantage resides in the fact that the outputs of the dual Schmitt triggers which cannot be switched to the high resistance state, i.e., the A and B outputs, can be used as continuous valid outputs while the A and B outputs of the dual triggers may be switched from valid to high resistance states. As noted above, by using selector switch SW-3, any input can be selected while all other debouncers or coupling circuits are in the high resistance output state and therefor can have no effect on the common information bus 10.

While a preferred embodiment has been shown and described, various modifications and substitutions may be made thereto without departing from the spirit and scope of the invention. Accordingly, it is to be understood that this invention has been described by way of illustration and not limitation.

What is claimed is:

1. A circuit responsive to the change in state of a switch for suppressing spurious electrical pulses associated with switch contact opening and closing comprising:

trigger circuit means, said trigger circuit means including a pair of series connected Schmitt trigger circuits, said trigger circuits each having an input terminal and a pair of output terminals, a first output of each of said trigger circuits having the capability of assuming either of two logic states or a high resistance state, said trigger circuit means having an output disable input which may be employed to cause the first outputs of the trigger circuits to assume the high resistance state;

means for delivering a signal commensurate with the state of a switch to the input terminal of the first of said series connected trigger circuits of said trigger circuit means;

means for connecting the first output terminal of the second of said series connected trigger circuits of said trigger circuit means to a logic output bus;

means for clamping the second output terminal of the first of said trigger circuits of said trigger circuit means to said input terminal of said first of said trigger circuits; and means for generating and selectively applying a signal to said trigger circuit means output disable input whereby said trigger circuit means will apply to the logic output bus either a logic signal commensurate with the signal delivered to the input terminal of the first of said series connected trigger circuits or will present a high resistance to the logic output bus.

2. The circuit of claim 1 wherein said clamping means comprises:

means capacitively coupling the input and second output terminals of said first Schmitt trigger circuit of said trigger circuit means whereby the firing of said first trigger circuit will be delayed until the input signal commensurate with the state of a switch has stabilized subsequent to a change in said signal.

3. The circuit of claim 2 wherein said means for generating and selectively applying a signal to the output disable input of said trigger circuit means comprises:

means for generating an enabling bias voltage; and switch means for selectively coupling said enabling bias voltage to said trigger circuit means output disable input, said trigger circuit means trigger circuits assuming the state wherein said first output terminals present a high resistance in the absence of said enabling bias signal.

4. The circuit of claim 2 wherein each of said Schmitt trigger circuits has a pair of complimentary logic output terminals and a second of said output terminals of the first trigger circuit is coupled to the input terminal of the first trigger circuit and the second of the output terminals of the first trigger circuit is connected to the input terminal of the second of the series connected trigger circuits.

5. The circuit of claim 3 wherein each of said Schmitt trigger circuits has a pair of complimentary logic output terminals and a second of said output terminals of the first trigger circuit is coupled to the input terminal of the first trigger circuit and the second of the output terminals of the first trigger circuit is connected to the input terminal of the second of the series connected trigger circuits.

6. The circuit of claim 1 wherein a signal commensurate with the state of at least a second switch is to be selectively coupled to the logic output bus and wherein said suppressing circuit further comprises:

second trigger circuit means, said second trigger circuit means including a pair of series connected Schmitt trigger circuits, said trigger circuits each having a pair of complimentary logic output terminals and an input terminal, a first of said output terminals assuming either of two logic states or a high resistance state, said trigger circuit means having an output disable input which may be employed to cause the first output terminal of the trigger circuits to assume the high resistance state;

means for delivering a signal commensurate with the state of a second switch to the input terminal of the first of said series connected trigger circuits of said second trigger circuit means;

means for connecting the first output terminal of the second of said series connected trigger circuits of said second trigger circuit means to the logic output bus;

means for clamping the second output terminal of the first of said trigger circuits of said second trigger circuit means to said input terminal of said first of said trigger circuits of said second trigger circuit means; and means for coupling signals provided by said generating means to said second trigger circuit means output disable input whereby said second trigger circuit means will apply to the logic output bus a logic signal commensurate with the signal delivered to the input terminal of the first of said series connected trigger circuits of said second trigger circuit means or will present a high resistance to the logic output bus.

7. The circuit of claim 6 wherein said means for generating and selectively applying an output disable signal comprises:

means for generating an enabling bias voltage; and switch means for selectively coupling said enabling bias voltage to either said first trigger circuit means output disable input or to said coupling means, said trigger circuit means trigger circuits selectively assuming the state wherein said first output terminals present a high resistance to the output bus in the absence of said enabling bias signal.

8. The circuit of claim 6 wherein said clamping means each comprise:

means capacitively coupling the input and second output terminals of said first Schmitt trigger circuit of said trigger circuit means whereby the firing of said first trigger circuit will be delayed until the input signal commensurate with the state of a switch has stabilized subsequent to a change in said signal.

9. The circuit of claim 8 wherein said clamping means each comprise:

means capacitively coupling the input and second output terminals of said first Schmitt trigger circuit of said trigger circuit means whereby the firing of said first trigger circuit will be delayed until the input signal commensurate with the state of a switch has stabilized subsequent to a change in said signal.

* * * * *

UNITED STATES PATENT AND TRADEMARK OFFICE
CERTIFICATE OF CORRECTION

PATENT NO. : 4,005,316
DATED : January 25, 1977
INVENTOR(S) : John H. Tomlinson

It is certified that error appears in the above—identified patent and that said Letters Patent are hereby corrected as shown below:

Column 2, line 53, change "A" to --$\bar{A}$--

Column 2, line 59, change "A and B" to --$\bar{A}$ and $\bar{B}$--

Column 2, line 62, "B" should be --$\bar{B}$--

Column 2, Line 65, "B" should be --$\bar{B}$--

Column 3, Line 43, "$B_{out}$" should be --$\bar{B}_{out}$--

Column 3, line 57, "B" should be --$\bar{B}$--

Column 3, line 78, "$A_{out}$" should be --$\bar{A}_{out}$--

Column 4, line 5, "A and B" should be --$\bar{A}$ and $\bar{B}$--

Signed and Sealed this

Twenty-sixth Day of April 1977

[SEAL]

Attest:

RUTH C. MASON
*Attesting Officer*

C. MARSHALL DANN
*Commissioner of Patents and Trademarks*